(12) United States Patent
Iguchi et al.

(10) Patent No.: US 11,136,257 B2
(45) Date of Patent: Oct. 5, 2021

(54) THICK-FILM RESISTIVE ELEMENT PASTE AND USE OF THICK-FILM RESISTIVE ELEMENT PASTE IN RESISTOR

(71) Applicant: KOA CORPORATION, Ina (JP)

(72) Inventors: Natsuki Iguchi, Nagano (JP); Yuya Iguchi, Nagano (JP); Koichi Urano, Nagano (JP)

(73) Assignee: KOA Corporation, Ina (JP)

( * ) Notice: Subject to any disclaimer, the term of this patent is extended or adjusted under 35 U.S.C. 154(b) by 0 days.

(21) Appl. No.: 16/640,441

(22) PCT Filed: Aug. 22, 2018

(86) PCT No.: PCT/JP2018/030963
§ 371 (c)(1),
(2) Date: Feb. 20, 2020

(87) PCT Pub. No.: WO2019/044618
PCT Pub. Date: Mar. 7, 2019

(65) Prior Publication Data
US 2020/0189960 A1    Jun. 18, 2020

(30) Foreign Application Priority Data
Aug. 31, 2017    (JP) .............................. JP2017-167102

(51) Int. Cl.
*H01K 1/00*    (2006.01)
*H01B 1/16*    (2006.01)
(Continued)

(52) U.S. Cl.
CPC ............... *C03C 3/00* (2013.01); *H01B 1/026* (2013.01); *H01B 1/22* (2013.01); *H01L 27/013* (2013.01); *H05K 1/095* (2013.01)

(58) Field of Classification Search
CPC ... H01B 1/00; H01B 1/16; H01B 1/22; C09D 5/24; H05K 1/095
See application file for complete search history.

(56) References Cited

U.S. PATENT DOCUMENTS 4,376,725 A *  3/1983  Prabhu ...................... C03C 8/02
                                                        252/512
4,415,624 A *  11/1983  Prabhu ................... C09D 11/52
                                                        252/512
(Continued)

FOREIGN PATENT DOCUMENTS

JP    H06-36902 A    2/1994
JP    H11-288801    10/1999
(Continued)

OTHER PUBLICATIONS

Written Opinion, and English translation of International Search Report, for Application No. PCT/JP2018/030963, dated Nov. 6, 2018, 6 pages.

*Primary Examiner* — Mark Kopec
(74) *Attorney, Agent, or Firm* — Crowell & Moring LLP

(57) ABSTRACT

This thick-film resistive element paste is a resistive element paste containing: an electrically conductive metal powder including a copper powder and a manganese powder; a glass powder; and an organic vehicle, and is characterized in that the glass powder contains primarily an alkaline-earth metal.

4 Claims, 2 Drawing Sheets

(51) Int. Cl.
*C03C 3/00* (2006.01)
*H01B 1/02* (2006.01)
*H01B 1/22* (2006.01)
*H01L 27/01* (2006.01)
*H05K 1/09* (2006.01)

(56) References Cited

U.S. PATENT DOCUMENTS

| 2008/0053592 | A1* | 3/2008 | Khadilkar | C03C 3/078 |
| | | | | 156/89.11 |
| 2015/0266090 | A1* | 9/2015 | Kamikoriyama | B22F 9/20 |
| | | | | 252/512 |
| 2018/0290917 | A1* | 10/2018 | Nishimura | C03C 3/064 |

FOREIGN PATENT DOCUMENTS

| JP | 2001-189187 A | 7/2001 |
| JP | 2005-353620 A | 12/2005 |
| JP | 2007-123301 A | 5/2007 |

\* cited by examiner

THICK-FILM RESISTIVE ELEMENT PASTE AND USE OF THICK-FILM RESISTIVE ELEMENT PASTE IN RESISTOR

This application is a 371 application of PCT/JP2018/030963 having an international filing date of Aug. 22, 2018, which claims priority to JP2017-167102 filed Aug. 31, 2017, the entire content of each of which is incorporated herein by reference.

TECHNICAL FIELD

The present invention relates to a thick-film resistive element paste and the use of a thick-film resistive element paste in a resistor.

BACKGROUND ART

Resistive paste compositions for obtaining low resistance characteristics are described in the following prior literature.

Patent Literature 1 discloses a resistive element paste technology in which, on a ceramic substrate having a Cu-based conductor arranged thereon, an electrically conductive powder composed of a mixture powder of a copper powder and a nickel powder (Cu/Ni=60/40 to 80/20), a glass powder, and a copper oxide powder are dispersed in a vehicle composed of an organic resin and a solvent.

Patent Literature 2 discloses a resistive element paste for a micro-chip resistor. The paste, in order to achieve low resistance values (not more than 100 mΩ) and a low TCR (not more than 300 ppm/° C.), is composed of: a copper-based electrically conductive metal powder containing at least copper; a silver powder; a glass frit; and an organic vehicle.

CITATION LIST

Patent Literature

Patent Literature 1: JP H11-288801 A
Patent Literature 2: JP 2007-123301 A

SUMMARY OF INVENTION

Technical Problem

The sheet resistance value of a resistor manufactured using a conventional resistive paste composition, such as noted above, is on the order of 50 mΩ/□. In order to obtain a lower resistance region (for example, a resistance region on the order of about 20 mΩ/□), it may be contemplated to increase the content of copper-based metal powder, for example.

However, the TCR of an elemental copper powder is extremely large, and if the copper-based metal powder is increased, the TCR of a thick-film resistive element increases. Thus, it has been difficult to achieve both low resistance value and low TCR.

An object of the present invention is to provide a thick-film resistive element paste with which it is possible to form a thick-film resistive element achieving low resistance value and low TCR and also having heat resistance.

Solution to Problem

The present invention is a thick-film resistive element paste for a low-resistance and highly heat-resistant thick-film resistor, characterized by including, as a glass component, mainly barium oxide or a combination of barium oxide and calcium oxide.

According to an aspect of the present invention, there is provided a resistive element paste containing: an electrically conductive metal powder including a copper powder and a manganese powder; a glass powder; and an organic vehicle. The glass powder contains primarily an alkaline-earth metal.

Preferably, the glass powder may include barium oxide as a principal component.

The electrically conductive metal powder may be composed of a mixture of two or more kinds of copper powder having different average grain sizes and the manganese powder. Of the copper powder, a copper powder (A) with a minimum average grain size and a copper powder (B) with a maximum average grain size may advisably have a grain size ratio satisfying (A)/(B)≥0.4.

Preferably, when a total amount of the electrically conductive metal powder is 100 wt %, the copper powder may be 80 to 90 wt %, and the manganese powder may be 5 to 20 wt %. The copper powder may include not more than 40 wt % of copper powder with an average grain size of 1 to 5 μm, and not less than 50 wt % of copper powder with an average grain size of 0.5 to 2 μm. The electrically conductive metal powder may be composed of a mixture of two or more kinds of copper powder having different grain shapes and the manganese powder, and the copper powder may advisably include a spherical copper powder and a flake-like copper powder.

The present invention also provides a use of the thick-film resistive element paste according to any one of the above in a thick-film resistive element film.

The description includes the contents disclosed in JP Patent Application No. 2017-167102 from which the present application claims the priority.

Advantageous Effects of Invention

According to the present invention, it is possible to form a thick-film resistive element achieving low resistance value and low TCR, and also having heat resistance.

DESCRIPTION OF EMBODIMENTS

Figure 1:
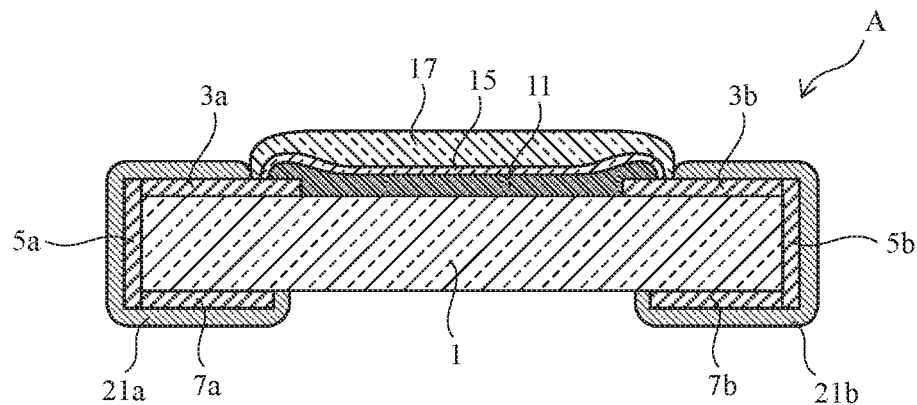
FIG. 1 is a cross sectional view illustrating a configuration example of a resistor in which a resistive element is formed using a thick-film resistive element paste according to an embodiment of the present invention.

Heat resistance herein means that there is little resistance value change when left in place at high temperature.

In the following, a thick-film resistive element paste technology according to embodiments of the present invention will be described with reference to the drawings, for example.

First, the targets of the thick-film resistive element paste technology according to the embodiments of the present invention are clarified.

(1) Target Values

In the following, sheet resistance, TCR, and heat resistance have the following target ranges:

1-1) Sheet resistance: 20 mΩ/□ or less
1-2) TCR: $100 \times 10^{-6}$/K (100 ppm/° C.)
1-3) Heat resistance: ΔR (%)≤±0.4% (high-temperature shelf test conditions: 155° C. for 1000 hours, or 175° C. for 1000 hours)

(2) Key Configuration for Achieving Target Values 2-1) A thick-film resistive element paste containing: an electrically conductive metal powder including copper and manganese; a glass powder including barium oxide as a principal component; and an organic vehicle.

According to what the present inventors have learned, a thick-film resistive element paste including copper and manganese as an electrically conductive metal powder, while useful for obtaining low resistance value/low TCR characteristics, has the problem that the resistance value increase is large when left in place at high temperature. The present inventors estimated that this was due to the influence of oxygen separating from zinc oxide (ZnO), included as a principal component in glass, and binding with manganese, thereby oxidizing manganese.

Accordingly, an oxide composed of barium (Ba)(or barium (Ba) and calcium (Ca) in combination), which binds with oxygen more strongly than manganese, is employed as a principal component of glass, thereby preventing oxidation of manganese and improving heat resistance.

2-2) The electrically conductive metal powder includes two or more kinds of copper with different average grain sizes.

According to what the present inventors have learned, when the principal component of glass is barium oxide (BaO) or a combination of barium oxide (BaO) and calcium oxide (CaO), the problem of an increase in resistance may likely result because the wettability of the above oxides with respect to the electrically conductive metal powder tends to be inferior to that of zinc oxide.

However, if the copper powder is increased to lower resistance, as noted above, the problem of an increase in TCR is caused.

Accordingly, two or more types of copper powder with different average grain sizes are contained so as to increase the contact area between metal powders and to improve electrically conductivity, thereby reducing resistance. That is, the electrically conductive metal powder includes at least three types, i.e., a copper powder with a large average grain size, a copper powder with a small average grain size, and a manganese powder.

In this way, resistance can be reduced without increasing the total amount of copper powder, making it possible to keep TCR low.

2-3) When the copper powders with two or more average grain sizes are compared, the grain size of a copper powder (A) with a minimum average grain size and that of a copper powder (B) with a maximum average grain size satisfy (A)/(B)≥0.4, and the copper powder with a minimum average grain size is in a range of from 0.5 to 2 μm.

It is important that the two or more types of copper powders with different average grain sizes be such that, compared to the copper powder with a maximum average grain size, the copper powder with a minimum average grain size has a size 0.4 times or more (the copper powder with a minimum average grain size is not too small). In the present embodiment, the average grain size is measured by laser diffractometry.

The greater the grain size difference, or the smaller the copper powder with a minimum average grain size, the contact area between the metal powders increases.

However, if a copper powder of a grain size twice or more greater than the minimum grain size is used, the grain size of the copper powder may turn out to be not suitable for screen printing, and if the ratio of the copper powder of a large grain size is increased, sintering may become difficult and an increase in resistance may result.

Conversely, if a copper powder of a grain size less than 0.4 times that of the copper powder with a maximum average grain size is used, or if the ratio of the small grain size is increased, the amount of resin required in the thick-film resistive element paste may increase, resulting in an increase in resistance.

By mixing copper powders with a small grain size difference, it becomes possible to increase the filling rate compared to the case of a unitary grain size, and to reduce resistance.

The copper powder includes a spherical copper powder and a flake-like copper powder.

2-4) As a copper powder, flake-like (flaky or scaly) particles are included.

Flake-like particles are more likely to melt during sintering than spherical particles, thereby increasing the contact area between metal powders and promoting formation of an alloy of manganese and copper. Accordingly, it is possible to improve electrical conductivity without increasing the total amount of copper powder. In this way, a decrease in resistance can be achieved.

FIG. 1 is a cross sectional view illustrating a configuration example of a resistor in which a resistive element is formed using the thick-film resistive element paste according to an embodiment of the present invention. As illustrated in FIG. 1, the resistor A includes: an insulating substrate 1 of alumina or the like; a resistive element 11 formed on the insulating substrate 1; front-surface electrodes 3a, 3b, end-surface electrodes 5a, 5b, back-surface electrodes 7a, 7b, and external electrodes 21a, 21b formed so as to cover said electrodes; and a first protection film 15 and a second protection film 17 which are formed on the resistive element 11.

In the following, the thick-film resistive element paste according to embodiments of the present invention will be described.

First Embodiment

In a first embodiment and a second embodiment, parameters of copper powder are different. In the first embodiment, copper powders with different average grain sizes are used.

(3) Thick-Film Resistive Element Paste 3-1) Electrically Conductive Metal Powder A manganese powder used is one with a grain size suitable for screen printing, such as with an average grain size on the order of 10 μm. The content is in a range of from 4 to 13 wt % relative to the total amount of the electrically conductive metal powder. The same manganese powder is used in any of the embodiments that follow.

The average grain size of the copper powder is as follows.

a) Copper powder (large grain size): Average grain size 1 to 5 μm

The content is in a range of 4 to 38 wt % relative to the total amount of the electrically conductive metal powder. Desirably, the tapped bulk density is not less than 3.9 g/cm³.

b) Copper powder (small grain size): Average grain size 0.5 to 2 μm (0.4 times or more relative to large grain size)

The content is in a range of 49 to 89 wt % relative to the total amount of the electrically conductive metal powder. Desirably, the tapped bulk density is not less than 2.7 g/cm$^3$.

3-2) Glass Powder

Desirably, the glass powder is composed of glass containing primarily barium oxide (BaO), and it is possible to use barium borosilicate-based glass and barium borosilicate calcium-based glass.

Other than the glass containing primarily barium oxide (BaO), it is possible to use glass compositions containing primarily alkaline-earths, such as calcium (Ca) and strontium (Sr). It is also possible to use a glass composition containing zinc oxide in order to improve wettability with metal powders, as well as the above glass compositions.

In high-temperature shelf tests as will be described later, a BaO—B$_2$O$_3$—SiO$_2$ glass, and a BaO/CaO—B$_2$O$_3$—SiO$_2$ glass were used.

In the present description, containing primarily Ba or Ba and Ca means that the principal component is BaO or BaO and CaO, and that their content is 20 to 70 wt % and desirably 30 to 70 wt % relative to the total amount of glass component.

3-3) Organic Vehicle

At least one resin selected from epoxy, phenol, imide, cellulose, butyral, acrylic and the like is dissolved in at least one solvent selected from terpineol, ethanol, butylcarbitol, butylcarbitol acetate and the like. Conventionally used organic vehicles may be used.

3-4) Other Additives 3-4-1) Inorganic Particles

Ceramics, a metal powder (Ag, Cu) other than the above, and the like may be added to adjust resistance value, film hardness, viscosity and the like. The grain size of primary particles is desirably less than 50 μm.

3-4-2) Copper Oxide Powder Material

In order to improve adhesion between the resistive element and the insulating substrate, CuO or Cu$_2$O may be added.

CuO or Cu$_2$O preferably has an average grain size of from 0.1 μm to 20 μm and more preferably has an average grain size of not more than 2 μm. The amount added is in a range not exceeding 10 wt % relative to the total amount of the electrically conductive metal powder.

Figure 2:
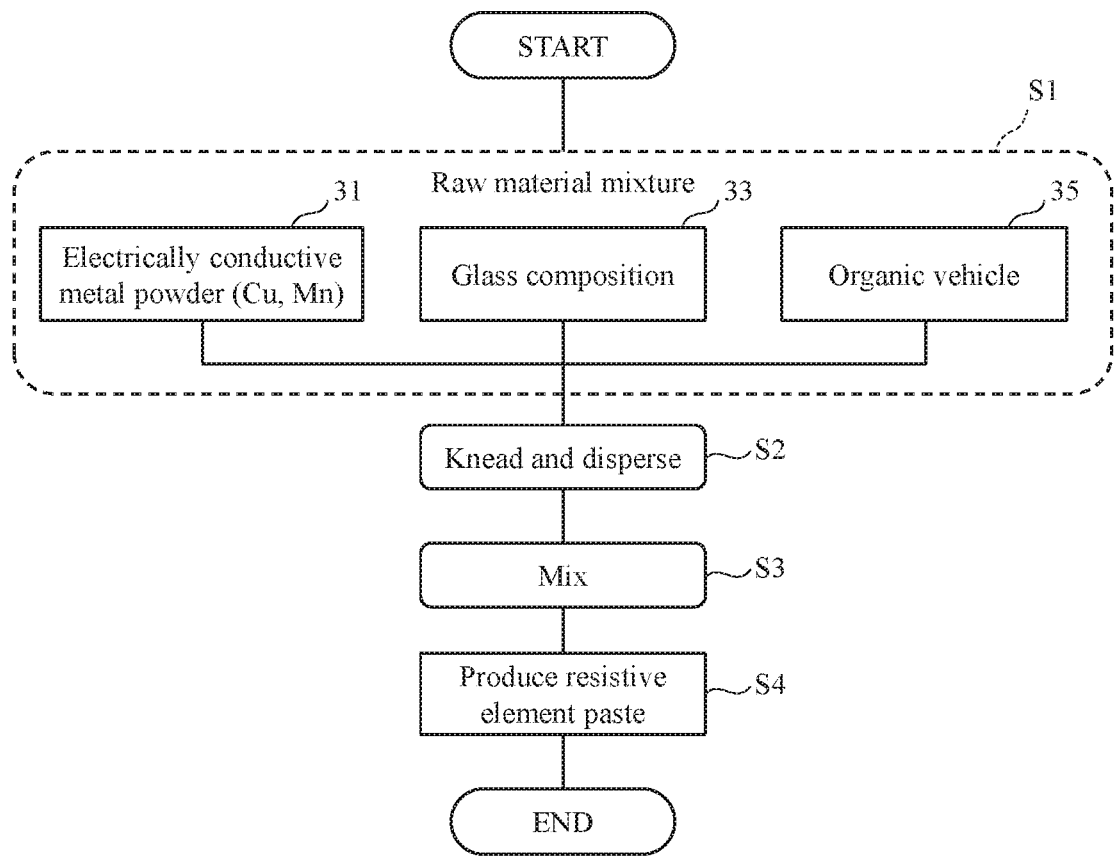
FIG. 2 is a flowchart illustrating a method of fabricating a thick-film resistive element paste.

(4) Method of Fabricating Thick-Film Resistive Element Paste, and Method of Manufacturing Resistor 4-1) Resistive Element Paste Fabrication Procedure FIG. 2 is a flowchart illustrating a method of fabricating a thick-film resistive element paste.

As the process is started (Start), in step S1, raw materials are mixed. For example, an electrically conductive metal powder (Cu, Mn) 31, a glass composition 33, and an organic vehicle 35 are mixed.

Then, in step S2, the raw material mixture is kneaded and dispersed, using a triple roll mill, for example. In step S3, mixing is performed using a mixer or the like. In step S4, a thick-film resistive element paste is produced (End).

4-2) Method of Manufacturing Resistor

Figure 3:
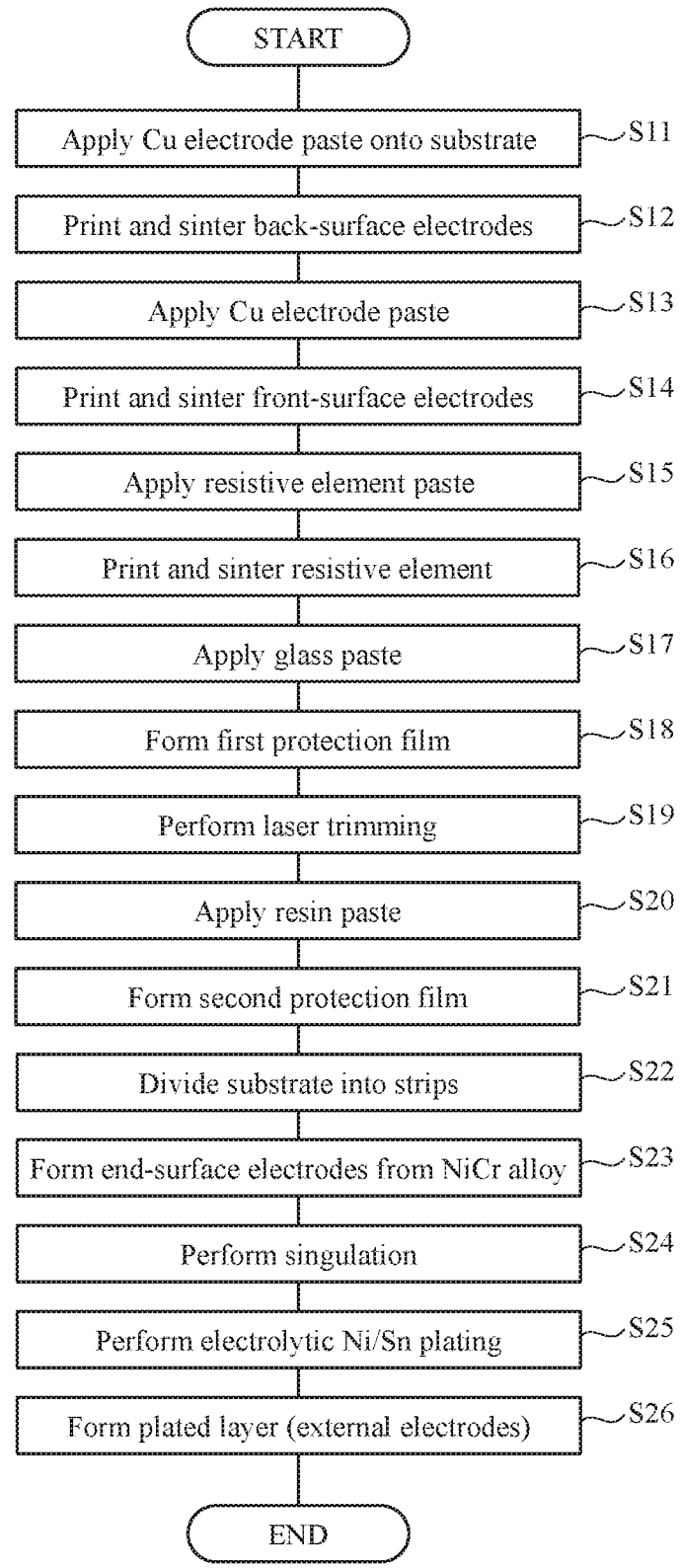
FIG. 3 is a flowchart illustrating a method of manufacturing a thick-film resistor including a thick-film resistive element.

FIG. 3 is a flowchart illustrating a method of manufacturing a thick-film resistor including a thick-film resistive element.

First, in step S11, a Cu-electrode paste is applied to the back surface of an alumina large-sized substrate 1, for example. In step S12, a pattern is formed by screen printing and then sintered at approximately 960° C., forming the back-surface electrodes 7a, 7b.

In step S13, the Cu-electrode paste is applied to the front-surface of the substrate 1. In step S14, a front-surface electrode pattern is formed by screen printing and then sintered at approximately 960° C., forming the front-surface electrodes 3a, 3b.

The front-surface electrodes 3a, 3b and the back-surface electrodes 7a, 7b may be formed from the same material, and may be sintered simultaneously. Either the front-surface electrodes 3a, 3b or the back-surface electrodes 7a, 7b may be formed first.

In step S15, the thick-film resistive element paste is applied. In step S16, a resistive pattern is formed by screen printing and then sintered at approximately 960° C., forming the resistive element 11.

Then, in step S17, a glass paste is applied or screen-printed onto the resistive element 11. In step S18, sintering is performed at approximately 670° C., forming the first protection film 15.

Then, in step S19, laser trimming is performed to adjust the resistance value of the resistive element 11.

In step S20, a resin paste is applied or screen-printed so as to cover the entire surface of the first protection film 15 and at least a part of the front-surface electrodes 3a, 3b. In step S21, the second protection film 17 is formed.

Then, in step S22, the substrate is divided into strips. In step S23, the end-surface electrodes 5a, 5b are formed by sputtering, using an NiCr alloy target, for example.

Then, in step S24, the substrate divided into strips is divided and singulated. In step S25, electrolytic plating is performed in the order of Ni/Sn, whereby, in step S26, the external electrodes 21a, 21b are formed.

Through the above steps, the resistor A can be manufactured.

Second Embodiment

In the second embodiment, copper powders with different particle shapes are used. The other conditions are the same.

a) Copper powder (spherical shape): The average grain size is not more than 20 μm and is in a screen-printable range.

The content is in a range of 40 to 89 wt % relative to the total amount of the electrically conductive metal powder.

b) Copper powder (flake-like shape): The average grain size is 5 to 25 μm.

The content is in a range of 40 to 89 wt % relative to the total amount of the electrically conductive metal powder.

The other parameters are the same.

In the following, evaluation results for the first embodiment and the second embodiment are described.

Evaluation Results for the First Embodiment (5) Evaluation of the Thick-Film Resistive Element Paste Evaluation results for the thick-film resistive element paste are described.

5-1) Sample

An evaluation specimen was fabricated by forming Cu electrodes on an alumina substrate, using the thick-film resistive element paste of the embodiment. As the evaluation specimen, a test pattern in which the thick-film resistive element was formed into a 1×50 mm rectangle was used. The number n of samples was 10 for each.

5-2) Target Values

In the following, target ranges with respect to sheet resistance, TCR, and heat resistance are indicated.

a) Sheet resistance: 20 mΩ/□ or less (film thickness after sintering 20 μm)

b) TCR: 100×10$^{-6}$/K or less (100 ppm/° C.)

c) Heat resistance: ΔR (%)≤±0.4% (high-temperature shelf test was at 155° C. for 1000 hours, or 175° C. for 1000 hours)

TABLE 1

<< Glass composition >>

| Component | Specimen 1<br>$SiO_2$—$B_2O_3$—BaO•CaO | Specimen 2<br>BaO—$SiO_2$—$B_2O_3$ | Specimen 3<br>BaO—$B_2O_3$—$SiO_2$ | Specimen 4<br>$B_2O_3$—BaO—$SiO_2$ | Specimen 5<br>BaO—$SiO_2$—$B_2O_3$ |
|---|---|---|---|---|---|
| BaO[%] | 15 to 35 | 50 to 70 | 20 to 30 | 20 to 30 | 50 to 70 |
| CaO[%] | 15 to 35 | — | — | — | — |
| $SiO_2$[%] | 5 to 25 | 5 to 25 | 20 to 30 | 20 to 30 | 5 to 35 |
| $B_2O_3$[%] | 30 to 35 | 15 to 25 | 20 to 30 | 20 to 30 | 15 to 25 |
| ZnO[%] | — | — | 0 to 5 | 0 to 5 | — |
| Others | Balance | Balance | Balance | Balance | Balance |

※ In the table, "—" indicates not containing, or containing within range of impurities.

5-3) Evaluation Results for Thick-Film Resistive Element

Using the glass composition systems shown in Table 1, five types of thick-film resistive element pastes (specimens 1 to 5) were fabricated, and thick-film resistive element samples were fabricated through the above steps.

Specimen 1 is a $SiO_2$—$B_2O_3$—BaO—CaO-based, specimen 2 is a BaO—$SiO_2$—$B_2O_3$-based, specimen 3 is a BaO—$B_2O_3$—$SiO_2$-based, specimen 4 is a $B_2O_3$—BaO—$SiO_2$-based, and specimen 5 is a BaO—$SiO_2$—$B_2O_3$-based glass composition system. Specimens 3, 4 contain an amount of ZnO smaller than that of BaO, which is the principal component.

The evaluation method involved taking measurements of sheet resistance value and TCR, and, for heat resistance evaluation, performing a high-temperature shelf test for monitoring resistance value change after being left in a high temperature environment of 155° C. or 175° C. for 1000 hours.

For specimen 6, as a comparative example, evaluation was performed with respect to a thick-film resistive element fabricated using a thick-film resistive element paste in which zinc borosilicate-based glass (ZnO—$B_2O_3$—$SiO_2$-based) had been used (left in high temperature for 500 hours).

Evaluation results are shown in Table 2.

Also, during the high-temperature shelf test, in each of specimens 1 to 5, the resistance value change (ΔR) was smaller than in the comparative example (specimen 6) and was within the target value (ΔR (%)≤±0.4%), indicating good results.

However, comparing the sheet resistance of specimens 1 to 6, it is seen from the results shown in Table 2 that, while specimens 1 to 5 had sheet resistances close to the target value, their values are higher than the value of the comparative example.

Accordingly, it was contemplated to lower sheet resistance by adjusting the grain size or grain shape of the metal powder (copper powder).

5-4) Example in which Copper Powders with Different Average Grain Sizes are Used Thick-film resistive element pastes (specimens 1-1 to 1-3) using the glass composition of specimen 1 among of the above-described glass compositions that had shown good evaluation results, and in which a manganese powder as an electrically conductive metal powder had been mixed with copper powders of two average grain sizes, were evaluated.

Specimen 1-1 had 20 g of spherical Cu of large grain size ($D_{50}$=1.7 μm), 70 g of spherical Cu of small grain size ($D_{50}$=0.79 μm), and 10 g of Mn. Specimen 1-2 had 30 g of

TABLE 2

«Evaluation results»
Glass composition system

| Characteristics | Specimen 1<br>$SiO_2$—$B_2O_3$—BaO•CaO | Specimen 2<br>BaO—$SiO_2$—$B_2O_3$ | Specimen 3<br>BaO—$B_2O_3$—$SiO_2$ | Specimen 4<br>$B_2O_3$—BaO—$SiO_2$ | Specimen 5<br>BaO—$SiO_2$—$B_2O_3$ | Specimen 6<br>(Com-parative example)<br>ZnO—$B_2O_3$—$SiO_2$ |
|---|---|---|---|---|---|---|
| R (mΩ/□/20 μm) | 19.48 | 21.97 | 19.62 | 21.42 | 20.88 | 14.85 |
| TCR ($10^{-6}$/K) | 43.12 | 44.75 | 85.08 | 50.90 | 41.71 | 101.55 |
| Left at high temperature of 155° C. ΔR(%) | 0.08 | 0.07 | 0.12 | 0.20 | 0.09 | 0.428 |
| Left at high temperature of 170° C. ΔR(%) | 0.19 | 0.28 | 0.31 | — | 0.34 | 0.54 (500 Hr) |

As shown in Table 2, it is seen that with the thick-film resistive element pastes (specimens 1 to 5) using glass according to the present embodiment in which BaO or BaO and CaO were the principal component, it is possible to keep TCR lower than in the comparative example (specimen 6).

spherical Cu of large grain size ($D_{50}$=1.7 μm), 60 g of spherical Cu of small grain size ($D_{50}$=0.79 μm), and 10 g of Mn. Specimens 1-3 had 60 g of spherical Cu of large grain size ($D_{50}$=3.0 μm), 30 g of spherical Cu of small grain size ($D_{50}$=1.3 μm), and 10 g of Mn.

TABLE 3

|  |  | Specimen 1-1 | Specimen 1-2 | Specimen 1-3 |
|---|---|---|---|---|
| Metal powder | Spherical Cu (g) (Large grain size) | 20 ($D_{50}$ 1.7 μm, 4.6 g/cm³) | 30 ($D_{50}$ 1.7 μm, 4.6 g/cm³) | 60 ($D_{50}$ 3.0 μm, 4.6 g/cm³) |
|  | Spherical Cu (g) (Small grain size) | 70 ($D_{50}$ 0.79 μm, 3.5 g/cm³) | 60 ($D_{50}$ 0.79 μm, 3.5 g/cm³) | 30 ($D_{50}$ 1.3 μm, 4.6 g/cm³) |
|  | Mn (g) | 10 | 10 | 10 |
| Glass (g) ($SiO_2$—$B_2O_3$—BaO•CaO) | | 5 | 5 | 5 |
| $Cu_2O$ (g) | | 5 | 5 | 5 |
| R (mΩ/□/20 μm) | | 19.93 | 17.50 | 17.95 |

TABLE 3-continued

|  | Specimen 1-1 | Specimen 1-2 | Specimen 1-3 |
|---|---|---|---|
| TCR ($10^{-6}$/K) | 33.90 | 49.59 | 35.71 |
| Left at high temperature of 155° C. ΔR(%) | 0.06 | 0.07 | −0.01 |

As shown in Table 3, in each of the specimens using any of the thick-film resistive element pastes, good evaluation was obtained against the target value for any of sheet resistance, TCR, and the results of high-temperature shelf test.

In particular, when the thick-film resistive element pastes of specimens 1-3 were used, sheet resistance, TCR, and the resistance value change rate were all well balanced, indicating good results. This is presumably due to the influence of high tapped bulk density in specimens 1-3, in addition to the fact that the grain size difference between the large grain size and small grain size of the spherical Cu is relatively large.

5-5) Conclusion

From the above results, it is seen that when copper powders with two or more average grain sizes are used, it is desirable to satisfy the following conditions.

5-5-1) The copper powder (A) with a minimum average grain size and the copper powder (B) with a maximum average grain size satisfy (A)/(B)≥0.4.

5-5-2) The minimum copper powder has an average grain size in a range of from 0.5 to 2 μm.

5-5-3) The copper powder has a tapped bulk density of not less than 3.0 g/cm³ and desirably not less than 4.6 g/cm³.

5-6) Influence of the Contents of Two Types of Copper Powder

In order to verify the influence of the content ratio of copper powders with two average grain sizes on the paste characteristics, samples (specimens 7 to 11) in which the contents of the two types of copper powder in specimen 6 were changed were fabricated, and sheet resistance and TCR were evaluated.

Specimen 7 had 0 g of spherical Cu of large grain size and 90 g of spherical Cu of small grain size. Specimen 8 had 9 g of spherical Cu of large grain size and 81 g of spherical Cu of small grain size. Specimen 9 had 18 g of spherical Cu of large grain size and 72 g of spherical Cu of small grain size. Specimen 10 had 27 g of spherical Cu of large grain size and 63 g of spherical Cu of small grain size. Specimen 11 had 90 g of spherical Cu of large grain size and 0 g of spherical Cu of small grain size.

TABLE 4

|  |  | Specimen 7 | Specimen 8 | Specimen 9 | Specimen 10 | Specimen 11 |
|---|---|---|---|---|---|---|
| ※Metal powder | Spherical Cu (g) (Large grain size) | 0 | 9 | 18 | 27 | 90 |
|  | Spherical Cu (g) (Small grain size) | 90 | 81 | 72 | 63 | 0 |
|  | Mn (g) | 10 | 10 | 10 | 10 | 10 |
| Glass (g) (ZnO—$B_2O_3$—$SiO_2$) | | 5 | 5 | 5 | 5 | 5 |
| $Cu_2O$ (g) | | 5 | 5 | 5 | 5 | 5 |
| R (mΩ/□/20 μm) | | 14.6 | 14.5 | 14.7 | 13.6 | 16.1 |
| TCR ($10^{-6}$/K) | | 92.4 | 71.1 | 68.5 | 82.8 | 73.8 |

※Large grain size, spherical Cu: $D_{50}$ 3.0 μm, 4.6 g/cm³
Small grain size, spherical Cu: $D_{50}$ 1.3 μm, 4.6 g/cm³

From Table 4, for spherical Cu of small grain size alone (specimen 7), TCR was 92.4×$10^{-6}$/K, which, although within the target value range, is a relatively high value. It has been learned that by mixing spherical Cu of large grain size therewith, it is possible to lower TCR with hardly any change in sheet resistance.

Among others, it was possible to obtain the lowest sheet resistance with the thick-film resistive element paste (specimen 10) in which 27 g of spherical Cu of large grain size and 63 g of spherical Cu of small grain size had been mixed.

Meanwhile, in the spherical Cu of large grain size alone (specimen 11), the sheet resistance was 16.1 mΩ/□, which, although within the target value range, is a relatively high value. This is presumably because, due to the large grain size of the spherical Cu of large grain size, fusion (sintering) did not proceed easily, and the formation of an alloy of Cu and Mn did not proceed sufficiently.

(Evaluation Results for the Second Embodiment)

Next, evaluation results for the second embodiment are described 5-7) Influence of the shape of copper powder particles Thick-film resistive element pastes (specimens 1-4 to 1-8) using the glass composition of specimen 1 and in which a manganese powder as an electrically conductive metal powder was mixed with two types of copper powder, i.e., a spherical copper powder and a flake-like copper powder, as copper powders of different grain shapes were evaluated.

As shown in Table 5, specimens 1-4 to 1-8 had 80 g of spherical Cu, 10 g of flake-like Cu, and 10 g of Mn. It should be noted that the grain size of spherical Cu and flake-like Cu is varied.

TABLE 5

| | | Specimen 1-4 | Specimen 1-5 | Specimen 1-6 | Specimen 1-7 | Specimen 1-8 |
|---|---|---|---|---|---|---|
| Metal powder | Spherical Cu (g) | 80 ($D_{50}$ 1.07 μm, 3.9 g/cm$^3$) | 80 ($D_{50}$ 1.3 μm, 4.6 g/cm$^3$) | 80 ($D_{50}$ 1.3 μm, 4.6 g/cm$^3$) | 80 ($D_{50}$ 0.79 μm, 3.5 g/cm$^3$) | 80 ($D_{50}$ 1.7 μm, 4.6 g/cm$^3$) |
| | Flake-like Cu (g) | 10 ($D_{50}$ 13.05 μm, 3.13 g/cm$^3$) | 10 ($D_{50}$ 13.05 μm, 3.13 g/cm$^3$) | 10 ($D_{50}$ 7.21 μm, 5.00 g/cm$^3$) | 10 ($D_{50}$ 13.05 μm, 3.13 g/cm$^3$) | 10 ($D_{50}$ 13.05 μm, 3.13 g/cm$^3$) |
| | Mn (g) | 10 | 10 | 10 | 10 | 10 |
| Glass (g) ($SiO_2$—$B_2O_3$—BaO•CaO) | | 5 | 5 | 5 | 5 | 5 |
| $Cu_2O$ (g) | | 5 | 5 | 5 | 5 | 5 |
| R (mΩ/□/20 μm) | | 20.48 | 19.48 | 19.03 | 18.11 | 17.70 |
| TCR ($10^{-6}$/K) | | 27.99 | 43.16 | 40.28 | 39.10 | 50.13 |
| Left at high temperature of 155° C. ΔR(%) | | 0.25 | −0.04 | −0.04 | 0.01 | 0.04 |

In specimens 1-5 to 1-8, due to the use of the glass composition of the present embodiment, low resistance (not more than 20 mΩ/□) and low TCR (not more than 100× $10^{-6}$/K) are achieved.

Further, in specimen 1-7, the resistance value change after being left at high temperature was ΔR (%)=0.01%, which is very small, indicating good results.

This is presumably because, due to the use of the relatively small grain size (D50=0.79 μm) of spherical Cu in addition to flake-like Cu, fusion (sintering) proceeded and formation of an alloy of Cu and Mn was promoted.

The embodiments of the present invention provide thick-film resistive element pastes enabling formation of a thick-film resistive element achieving low resistance values and low TCR and also having heat resistance. Because the paste contains glass, sufficient adhesion with a substrate can be ensured, which is preferable when utilized in a resistive element layer of a resistor. In addition, the volume resistivity is low, so that a decrease in resistance can be achieved in a resistor fabricated using the thick-film resistive element pastes.

In the foregoing embodiments, configurations and the like illustrated in the attached drawings are not limiting and may be modified, as appropriate, within a scope in which the effects of the present invention can be obtained. Other modifications may be made and implemented, as appropriate, without departing from the scope of the object of the present invention.

The respective constituent elements of the present invention may be selectively adopted or not adopted, and an invention provided with a selected configuration is also included in the present invention.

INDUSTRIAL APPLICABILITY

The present invention is applicable to a thick-film resistive element paste.

All publications, patents and patent applications cited in the present description are incorporated herein by reference in their entirety.

The invention claimed is:

1. A thick-film resistor comprising:
   an insulating substrate;
   a thick-film resistive element film formed on the insulating substrate;
   a surface electrode; and
   an end-surface electrode;
   wherein the thick-film resistive element film is the product of sintering of a resistive element paste consisting of: an electrically conductive metal powder consisting of a copper powder and a manganese powder; a glass powder; and an organic vehicle; and
   wherein the glass powder contains barium oxide, or barium oxide and calcium oxide, as a principal component.

2. The thick film resistor according to claim 1, wherein the copper powder is composed of a mixture of two or more kinds of copper powder, the two or more kinds each having a different average grain size;
   wherein the two or more kinds include a copper powder (A) with a minimum average grain size and a copper powder (B) with a maximum average grain size; and
   wherein the copper powder has a grain size ratio satisfying (A)/(B)≥0.4.

3. The resistive element paste according to claim 1, wherein a total of the electrically conductive metal powder corresponds to 100 wt %, the copper powder is present in 80 to 90 wt %, and the manganese powder is present in 10 to 20 wt %; and
   wherein the copper powder includes not more than 40 wt % of copper powder with an average grain size of 1 to 5 μm, and not less than 50 wt % of copper powder with an average grain size of 0.5 to 2 μm.

4. The thick-film resistor according to claim 1, wherein the copper powder is composed of a mixture of two or more kinds of copper powder having different grain shapes; and
   wherein the copper powder includes a spherical copper powder and a flake-like copper powder.

* * * * *